(12) United States Patent
Peng

(10) Patent No.: US 9,129,876 B2
(45) Date of Patent: Sep. 8, 2015

(54) IMAGE SENSOR AND PROCESS THEREOF

(71) Applicant: UNITED MICROELECTRONICS CORP., Hsin-Chu (TW)

(72) Inventor: Chun-Hong Peng, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/903,987

(22) Filed: May 28, 2013

(65) Prior Publication Data

US 2014/0353787 A1    Dec. 4, 2014

(51) Int. Cl.
*H01L 27/146* (2006.01)

(52) U.S. Cl.
CPC .... *H01L 27/14627* (2013.01); *H01L 27/14621* (2013.01); *H01L 27/14636* (2013.01); *H01L 27/14645* (2013.01); *H01L 27/14667* (2013.01); *H01L 27/14685* (2013.01); *H01L 27/14687* (2013.01)

(58) Field of Classification Search
CPC .............. H01L 27/14627; H01L 27/14685; H01L 27/14621; H01L 27/14645; H01L 27/14667
USPC ................................................. 257/292, 462
See application file for complete search history.

(56) References Cited

U.S. PATENT DOCUMENTS

| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |
| 6,081,018 A | 6/2000 | Nakashiba |
| 6,087,211 A | 7/2000 | Kalnitsky |

(Continued)

FOREIGN PATENT DOCUMENTS

KR    1020060133178 A    * 12/2006

*Primary Examiner* — Phat X Cao
(74) *Attorney, Agent, or Firm* — Winston Hsu; Scott Margo

(57) ABSTRACT

An image sensor including a microlens, a substrate, a first dielectric layer, a second dielectric layer and a color filter is provided. The microlens receives light; the substrate includes a light sensing element in a light sensing area for receiving light incident to the microlens. The first dielectric layer and the second dielectric layer are stacked on the substrate from bottom to top, wherein the second dielectric layer has a recess on the first dielectric layer and in an optical path between the microlens and the light sensing element. The color filter is disposed in the recess. Moreover, the present invention also provides an image sensing process for forming said image sensor.

20 Claims, 6 Drawing Sheets

(56) References Cited

U.S. PATENT DOCUMENTS

| | | | |
|---|---|---|---|
| 6,124,200 | A | 9/2000 | Wang |
| 6,294,313 | B1 | 9/2001 | Kobayashi |
| 6,297,160 | B1 | 10/2001 | Chien |
| 6,338,976 | B1 | 1/2002 | Huang |
| 6,352,876 | B1 | 3/2002 | Bordogna |
| 6,369,417 | B1 | 4/2002 | Lee |
| 6,376,797 | B1 | 4/2002 | Piwczyk |
| 6,388,278 | B1 | 5/2002 | Suzuki |
| 6,407,415 | B2 | 6/2002 | Lee |
| 6,433,844 | B2 | 8/2002 | Li |
| 6,482,669 | B1 | 11/2002 | Fan |
| 6,514,810 | B1 | 2/2003 | Kim |
| 6,566,151 | B2 | 5/2003 | Yeh |
| 6,617,189 | B1 | 9/2003 | Lin |
| 6,632,700 | B1 | 10/2003 | Fan |
| 6,641,464 | B1 | 11/2003 | Steere, III |
| 6,664,191 | B1 | 12/2003 | Kim |
| 6,730,555 | B2 | 5/2004 | Kim |
| 6,794,215 | B2 | 9/2004 | Park |
| 6,821,809 | B2 | 11/2004 | Abe |
| 6,841,848 | B2 | 1/2005 | MacNamara |
| 6,846,722 | B2 | 1/2005 | Lee |
| 6,849,533 | B2 | 2/2005 | Chang |
| 6,872,584 | B2 | 3/2005 | Nakashiba |
| 6,921,934 | B2 | 7/2005 | Patrick |
| 6,933,972 | B2 | 8/2005 | Suzuki |
| 6,953,608 | B2 | 10/2005 | Leu |
| 6,960,512 | B2 | 11/2005 | Cheng |
| 7,006,294 | B2 | 2/2006 | Steenblik |
| 7,078,779 | B2 | 7/2006 | Wang |
| 7,115,924 | B1 | 10/2006 | LaMaster |
| 7,129,172 | B2 | 10/2006 | Morrow |
| 7,180,044 | B2 | 2/2007 | Yu |
| 7,193,289 | B2 * | 3/2007 | Adkisson et al. .............. 257/431 |
| 7,199,439 | B2 | 4/2007 | Farnworth |
| 7,229,745 | B2 | 6/2007 | Lamarre |
| 7,315,359 | B2 | 1/2008 | Hong |
| 7,328,915 | B2 | 2/2008 | Smith |
| 7,498,190 | B2 | 3/2009 | Kao |
| 7,648,851 | B2 | 1/2010 | Fu |
| 2001/0023086 | A1 | 9/2001 | Park |
| 2004/0000669 | A1 * | 1/2004 | Yamamura ...................... 257/72 |
| 2004/0122328 | A1 | 6/2004 | Wang |
| 2005/0024520 | A1 | 2/2005 | Yamamoto |
| 2005/0103983 | A1 | 5/2005 | Yamaguchi |
| 2005/0121599 | A1 | 6/2005 | Mouli |
| 2005/0186739 | A1 | 8/2005 | Wang |
| 2005/0247963 | A1 | 11/2005 | Chen |
| 2005/0274988 | A1 | 12/2005 | Hong |
| 2005/0274996 | A1 | 12/2005 | Iwawaki |
| 2006/0054946 | A1 | 3/2006 | Baek |
| 2006/0124833 | A1 | 6/2006 | Toda |
| 2006/0146230 | A1 | 7/2006 | Joon |
| 2006/0146412 | A1 | 7/2006 | Kim |
| 2006/0172451 | A1 | 8/2006 | Park |
| 2006/0183265 | A1 | 8/2006 | Oh |
| 2006/0231898 | A1 | 10/2006 | Jeong |
| 2007/0010042 | A1 | 1/2007 | Li |
| 2007/0012970 | A1 | 1/2007 | Mouli |
| 2007/0018073 | A1 | 1/2007 | Hsu |
| 2007/0023851 | A1 | 2/2007 | Hartzell |
| 2007/0031988 | A1 | 2/2007 | Agranov |
| 2007/0052050 | A1 | 3/2007 | Dierickx |
| 2007/0072326 | A1 | 3/2007 | Zheng |
| 2007/0096173 | A1 | 5/2007 | Kim |
| 2007/0117253 | A1 | 5/2007 | Hsu |
| 2007/0158772 | A1 * | 7/2007 | Boettiger ...................... 257/432 |
| 2007/0166649 | A1 | 7/2007 | Yu |
| 2007/0202696 | A1 | 8/2007 | Inuiya |
| 2008/0017945 | A1 * | 1/2008 | Wu et al. ...................... 257/440 |
| 2008/0036020 | A1 | 2/2008 | Ko |
| 2008/0055733 | A1 | 3/2008 | Lim |
| 2008/0079103 | A1 | 4/2008 | Liao |
| 2008/0121805 | A1 | 5/2008 | Tweet |
| 2008/0121951 | A1 | 5/2008 | Kao |
| 2008/0157144 | A1 | 7/2008 | Lee |
| 2008/0169546 | A1 | 7/2008 | Kwon |
| 2008/0265348 | A1 | 10/2008 | Maas |
| 2009/0066954 | A1 | 3/2009 | Opsal |
| 2009/0121264 | A1 | 5/2009 | Kao |
| 2009/0124037 | A1 | 5/2009 | Yu |
| 2009/0127643 | A1 | 5/2009 | Lu |
| 2009/0134484 | A1 | 5/2009 | Lin |
| 2009/0168181 | A1 | 7/2009 | Su |
| 2009/0200585 | A1 | 8/2009 | Nozaki |
| 2009/0212335 | A1 | 8/2009 | Kao |
| 2009/0256258 | A1 | 10/2009 | Kreupl |
| 2009/0294888 | A1 | 12/2009 | Tsai |
| 2009/0321862 | A1 | 12/2009 | Yu |
| 2010/0003623 | A1 | 1/2010 | Liu |
| 2010/0038688 | A1 | 2/2010 | Wu |
| 2010/0044813 | A1 | 2/2010 | Wu |
| 2010/0096359 | A1 | 4/2010 | Shiu |
| 2010/0144156 | A1 | 6/2010 | Shih |
| 2010/0159632 | A1 | 6/2010 | Rhodes |
| 2010/0315734 | A1 | 12/2010 | Wu |
| 2011/0057277 | A1 | 3/2011 | Yu |

* cited by examiner

IMAGE SENSOR AND PROCESS THEREOF

BACKGROUND OF THE INVENTION

1. Field of the Invention

The present invention relates generally to an image sensor and a process thereof, and more specifically to an image sensor and a process thereof that forms a color filter in an inter metal dielectric (IMD).

2. Description of the Prior Art

CMOS image sensors (CIS) are based on CMOS technologies, so the CMOS image sensors are compatible with the typical CMOS fabrication processes. They integrate additional signal processing logic elements on a same substrate, wherein it is possible to dispose sensor arrays. Thus, CMOS image sensors (CIS) are widely used.

An image sensor may be divided into function areas, such as a light sensing area and a peripheral electronic circuit area. The light sensing area comprises a plurality of photodiodes arranged in an array, and MOS transistors for sensing the light intensity, i.e. a reset transistor, a current source follower and a row selector. The peripheral electronic circuit area connects interconnects to external connections. A main function of the image sensor is to divide incident light beams into combinations of light beams of different wavelengths. The light is received by a plurality of imaging devices on the semiconductor substrate and transformed into digital signals of different intensities. For instance, an incident beam is divided into a combination of red, green and blue light and then received by corresponding photodiodes. Each photodiode transforms the light intensity into digital signals.

Some of the CIS systems use the Front Side Illumination (FSI) technology to form the pixels of a pixel array. In FSI CMOS image sensors, light is transmitted to a photo-sensing area through the front side of the pixel. This means that the incident light has to pass through dielectric layers, and metal layers before it reaches the photo-sensing area. The performances of the formed image sensors are enhanced through increasing the quantum efficiency (QE), reducing the cross talks between pixels, and reducing the dark current, which is achieved by improving the layout of the microlens, the color filters and the photo-sensing areas.

SUMMARY OF THE INVENTION

The present invention provides an image sensor and a process thereof that forms a color filter in an inter metal dielectric (IMD) and adjusts the position of the color filter by controlling the location and the depth of a recess in which the color filter is disposed.

The present invention provides an image sensor including a microlens, a substrate, a first dielectric layer, a second dielectric layer and a color filter. The microlens receives the light. The substrate includes a light sensing element in a light sensing area that receives the light incident to the microlens. The first dielectric layer and the second dielectric layer are stacked on the substrate from bottom to top, wherein the second dielectric layer has a recess on the first dielectric layer and in an optical path between the microlens and the light sensing element. The color filter is disposed in the recess.

The present invention provides an image sensing process including the following steps. A substrate including a light sensing element in a light sensing area is provided. A first dielectric layer and a second dielectric layer stacked on the substrate are sequentially formed. A recess is formed in the second dielectric layer. A color filter is formed in the recess on the first dielectric layer. A microlens is formed above the color filter, thereby enabling the light sensing element to receive the light incident to the microlens and passing through the color filter.

According to the above, the present invention provides an image sensor and process thereof that forms a recess in a second dielectric layer, enabling a color filter disposed in the recess and on the first dielectric layer to optimize a light path passing through the color filter to a light sensing element. Moreover, the depth, the size and the location of the recess can be adjusted to control the light path and the thickness of the color filter, thereby increasing the light sensitivity and improving the color division of a formed image sensor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIGS. 1-9 schematically depict cross-sectional views of an image sensing process according to an embodiment of the present invention.
Figure 1:
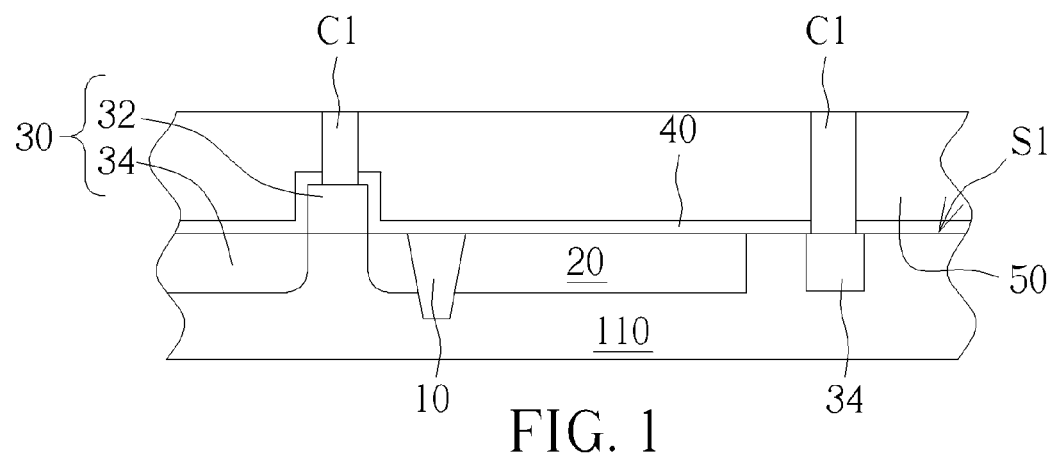

FIGS. 1-9 schematically depict cross-sectional views of an image sensing process according to an embodiment of the present invention. As shown in FIG. 1, a previous process of an image sensing process including the following steps is performed. A substrate 110 having a side S1 is provided, wherein the side S1 is an active side in this embodiment. The substrate 110 has a light sensing area A and a periphery area B beside the light sensing area A as divided by the purpose of later formed structures therein. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 is formed on the side S1 of the substrate 110 to electrically isolate the sensing area A from the periphery area B, wherein the isolation structure 10 may be a shallow trench isolation structure, which may be formed through a shallow trench isolation process, but not limited thereto. Then, a light sensing element 20, such as photodiodes arranged in a matrix, is formed in the light sensing area A on a side of the isolation structures 10 to receive the incident light, while at least a MOS transistor 30 is formed on another side of the isolation structures 10. The MOS transistor 30 may be a reset transistor, a current source follower or a row selector used to transform the detected light beams into digital signals, or a logical MOS transistor in the periphery circuit region, but not limited thereto. The MOS transistor 30 may include a gate 32 on the substrate 110 and a source/drain 34 in the substrate 110 beside the gate 32. A selective contact etch stop layer (CESL) 40 may conformally cover the substrate 110 and the MOS transistor 30. The selective contact etch stop layer 40 may be a doped nitride layer, but it is not limited thereto. In this embodiment, a single isolation structure 10, a single light sensing element 20 and a single MOS transistor 30 are depicted in the accompanying figures, but the numbers of these components are not restricted thereto.

A dielectric layer 50 is entirely formed on the side S1 of the substrate 110 (or on the selective contact etch stop layer 40).

The dielectric layer 50 may be an interdielectric layer, which may be an oxide layer, but it is not limited thereto. Contact holes (not shown) are formed in the dielectric layer 50 through an etching process, and conductive materials, such as copper or tungsten, are filled into the contact holes (not shown) to form contact plugs C1 respectively connecting the gate 32 and the source/drain 34 of the MOS transistor 30. Furthermore, other semiconductor components may also be disposed on the substrate 110 and in the dielectric layer 50. For example, other interconnect structures or other elements (not shown) may also be disposed in the dielectric layer 50, but they are not described here one by one.

Figure 2:
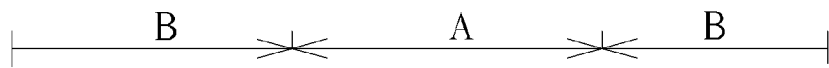
Figure 2:
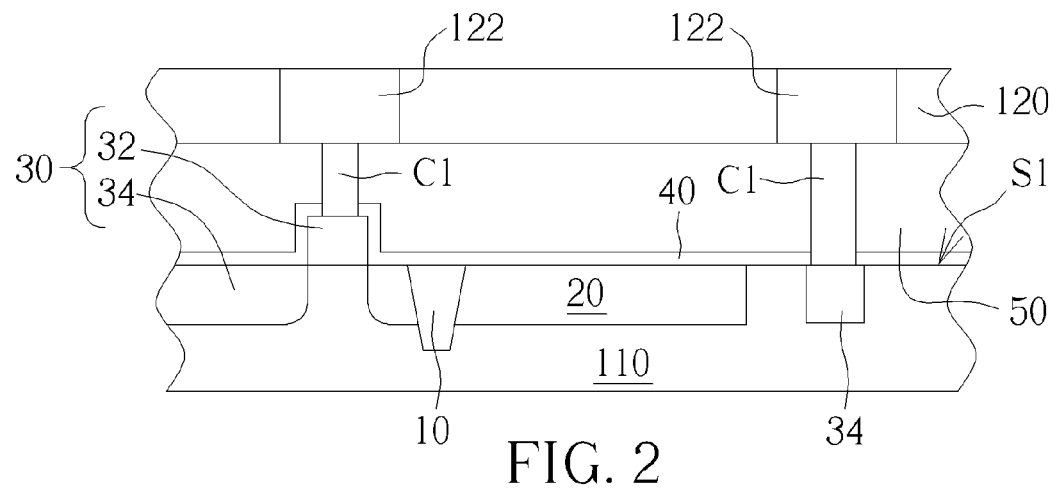

As shown in FIG. 2, a first dielectric layer 120 is formed on the dielectric layer 50 and the contact plugs C1. More precisely, a first dielectric layer (not shown) maybe formed to entirely cover the dielectric layer 50 and the contact plugs C1. Then, a planarization process may be performed to form the first dielectric layer 120. Thereafter, vias (not shown) may be formed in the first dielectric layer 120 by methods such as etching, and a metal such as copper or other metals is filled into the vias to form a metal interconnect structure 122 in the first dielectric layer 120 corresponding to the periphery area B and electrically connected to the contact plugs C1. In this embodiment, the first dielectric layer 120 is just a single layer of patterned inter metal dielectric (IMD) and includes metal interconnect structures 122. In another embodiment, the first dielectric layer 120 may include multi-layers of patterned inter metal dielectric (IMD), and may include metal interconnect structures.

Figure 3:
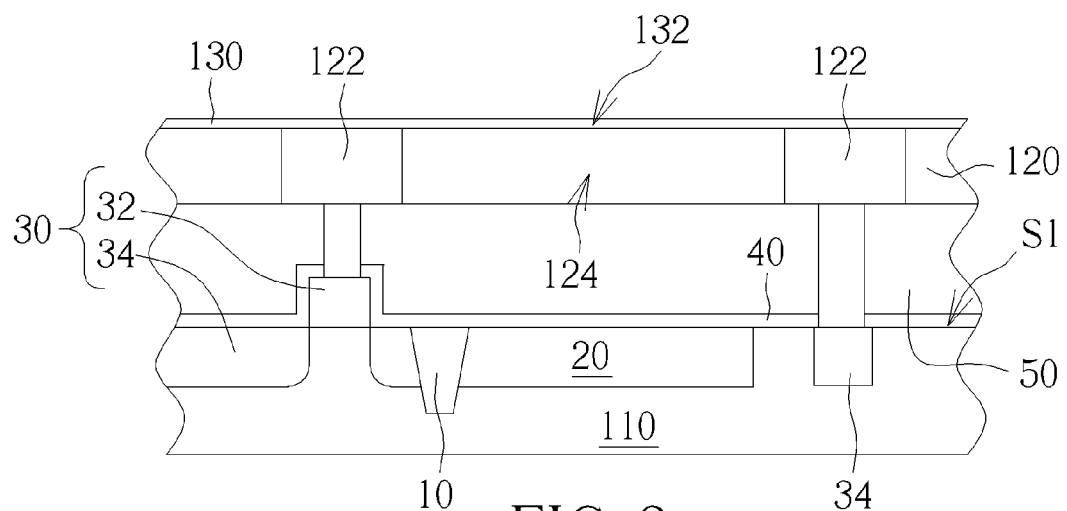

As shown in FIG. 3, an etch stop layer 130 is formed on the first dielectric layer 120 and the metal interconnect structure 122. The etch stop layer 130 may include a nitride layer, a silicon rich oxide layer, a silicon carbide layer or a carbon doped silicon nitride layer, but it is not limited thereto. In this embodiment, a part 132 of the etch stop layer 130 corresponding to the light sensing element 20 in the light sensing area A below is not etched at this time. The part 132 of the etch stop layer 130 will be removed in later processes after using the etch stop layer 130 to form a recess. In another embodiment, the part 132 of the etch stop layer 130 may be removed at this time while a later formed recess will be formed above the etch stop layer 130 without contacting it. A part 124 of the first dielectric layer below in an optical path between a later formed microlens and the light sensing element 20 will be exposed, but it is not limited thereto.

Figure 4:
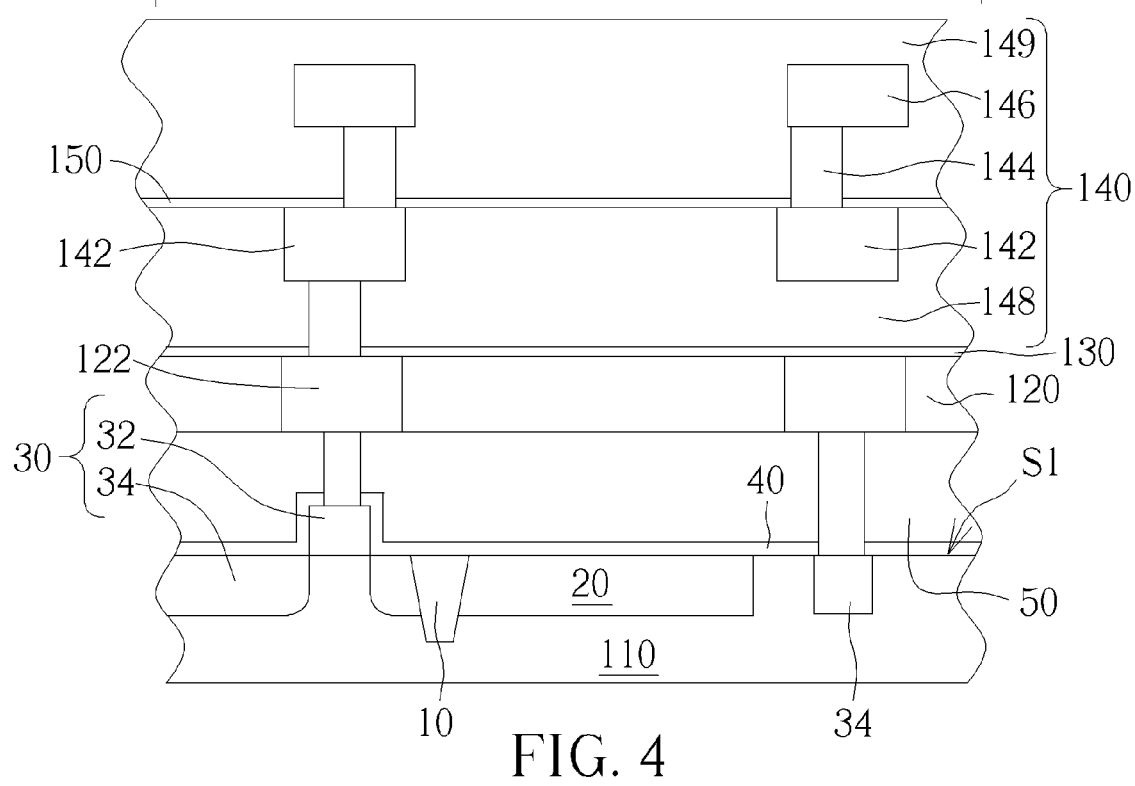

As shown in FIG. 4, a second dielectric layer 140 containing metal interconnect structures 142 and 144 and a cap structure 146 is formed on the etch stop layer 130. More precisely, a planarized dielectric layer 148 may be formed to entirely cover the etch stop layer 130; then, vias (not shown) may be formed in the planarized dielectric layer 148 by methods such as etching, and a metal, such as copper, is filled into the vias to form the metal interconnect structure 142 in the planarized dielectric layer 148 corresponding to the periphery area B. In this embodiment, the etch stop layer 130 is used to stop the etching during the formation of the vias, and the etch stop layer 130 is broken through by the same etching process or other processes, thereby enabling the metal interconnect structure 142 to electrically connect the metal interconnect structure 122, but it is not limited thereto. Repeatedly, a planarized dielectric layer 149 containing the metal interconnect structure 144 and the cap structure 146 is formed by a similar method. In this embodiment, the second dielectric layer 140 includes multi-layers of patterned inter metal dielectric (IMD), and may contain metal interconnect structures; in another embodiment, the second dielectric layer 140 may just include a single layer of patterned inter metal dielectric (IMD) having a metal interconnect structure, but it is not limited thereto. Furthermore, an etch stop layer 150 may be formed between the planarized dielectric layers 148 and 149, and the etch stop layer 150 may be patterned as the formation of the metal interconnect structure 144, enabling the metal interconnect structures 142 and 144 to be electrically connected to each other. The etch stop layer 150 may include a nitride layer, a silicon rich oxide layer, a silicon carbide layer or a carbon doped silicon nitride layer; the cap structure 146 may be aluminum, but is it not limited thereto.

Figure 5:
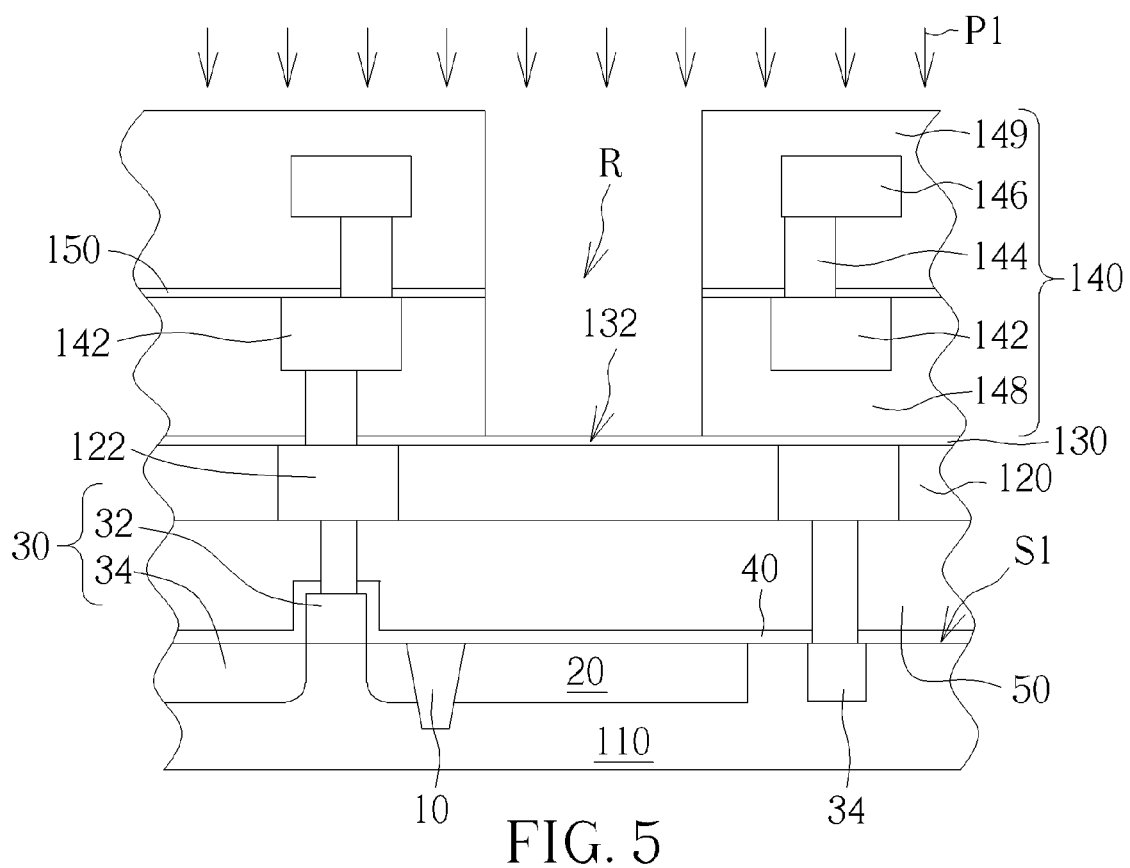

As shown in FIG. 5, a recess R is formed in the second dielectric layer 140 and the part 132 of the etch stop layer 130 is therefore exposed. In this embodiment, an etching process P1 is performed to form the recess R by using the etch stop layer 130 to stop the etching, but it is not limited thereto. The etching process P1 may include etching processes having multi-etching steps for etching these layers including the second dielectric layer 140 and the etch stop layer 150 or others respectively. Thus, the etching process P1 may include dry etching processes or/and wet etching processes.

Figure 6:
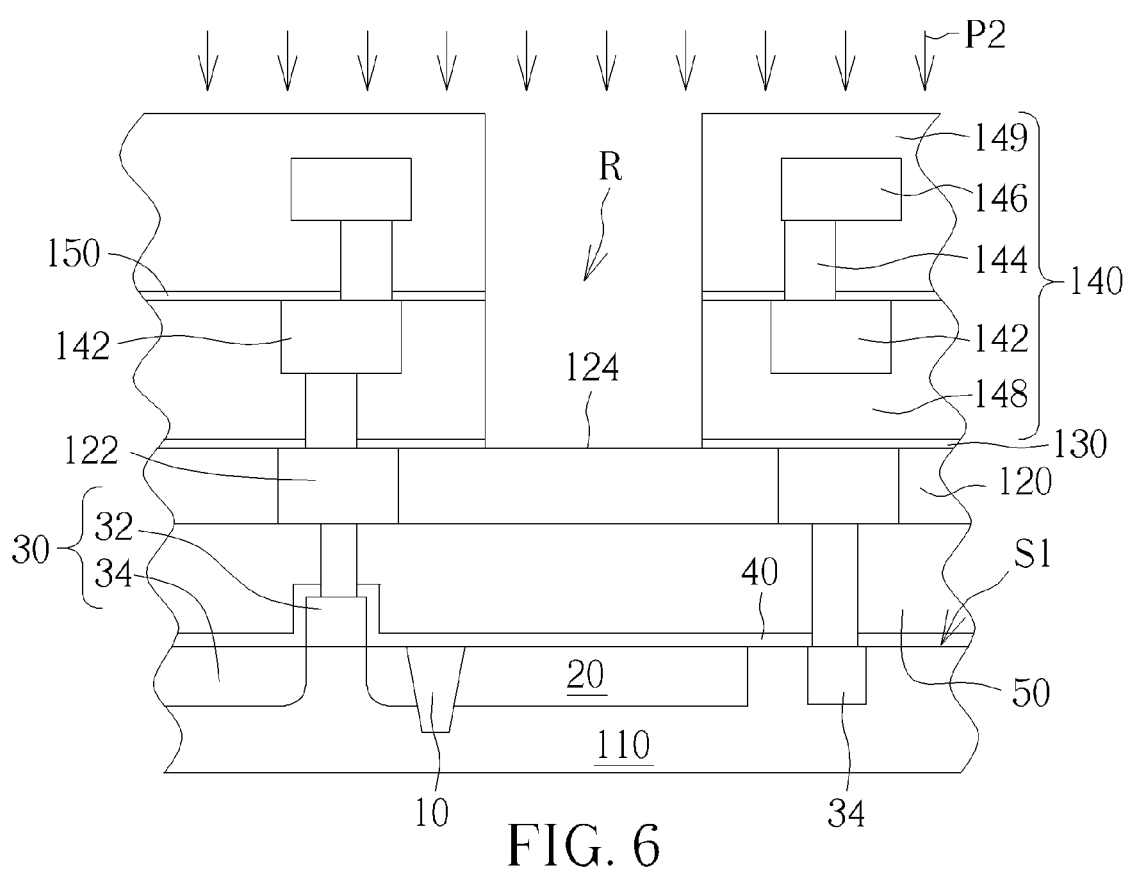

An etching process P2 is performed to etch the part 132 of the etch stop layer 130, and the part 124 of the first dielectric layer 120 is therefore exposed, as shown in FIG. 6. It is emphasized that the part 132 of the etch stop layer 130 is in an optical path between a later formed microlens and the light sensing element 20, so it must be etched to allow light to pass through if the etch stop layer 130 is composed of non-transparent materials. In another embodiment, when the etch stop layer 130 is composed of transparent materials, the etch stop layer 130 may not be etched.

Figure 7:
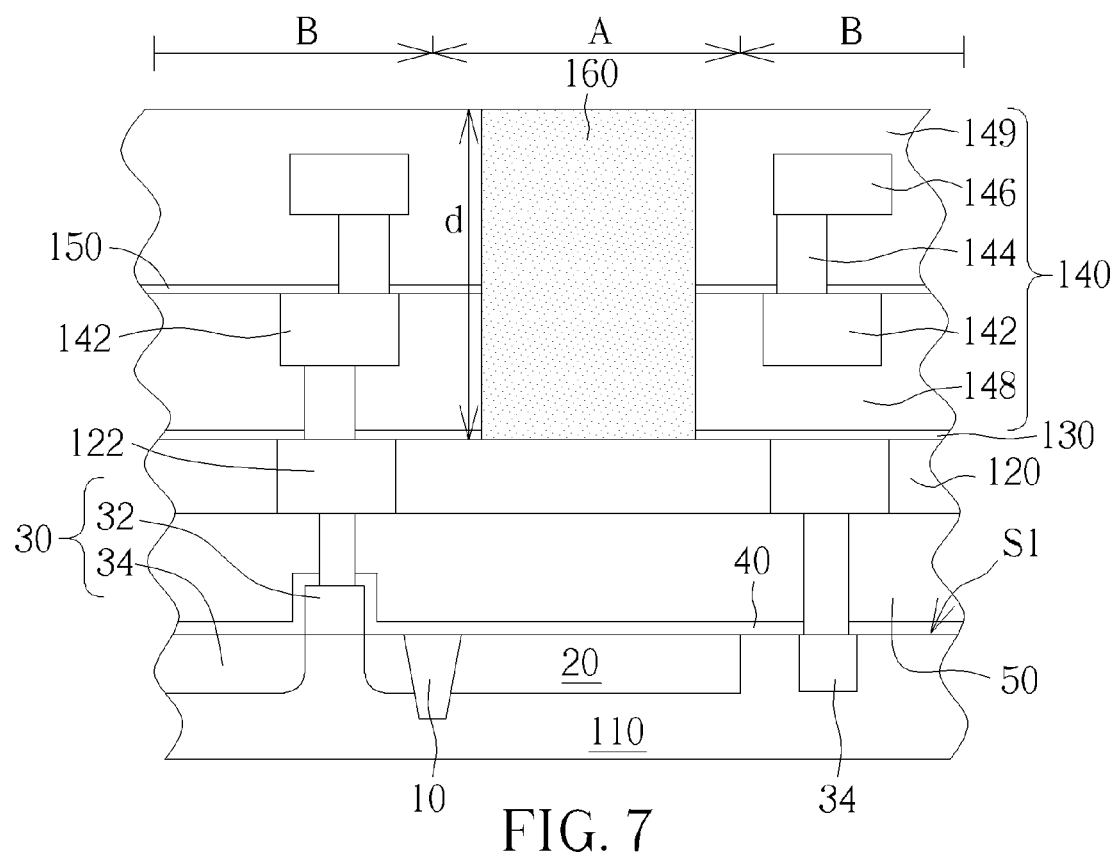

A color filter 160 is formed in the recess R on the first dielectric layer 120, as shown in FIG. 7. The color filter 160 may include red, green and blue color filter pixels to divide red light, green light and blue light, but it is not limited thereto. Preferably, the thickness d of the color filter 160 is comprised in a range of 1 μm ~2 μm to have better light sensitivity and enhanced color division of wavelengths. When the thickness of the color filter 160 is thicker than this range, the sensitivity of the color filter 160 degrades; when the thickness of the color filter 160 is thinner than this range, white light may not be divided accurately into red, green and blue light or light with other wavelengths. It is emphasized that the thickness of the color filter 160 and the light path passing through the color filter 160 to the light sensing element 20 can be controlled by adjusting the depth, the size and the location of the recess R formed in the second dielectric layer 140 and on the first dielectric layer 120.

Figure 8:
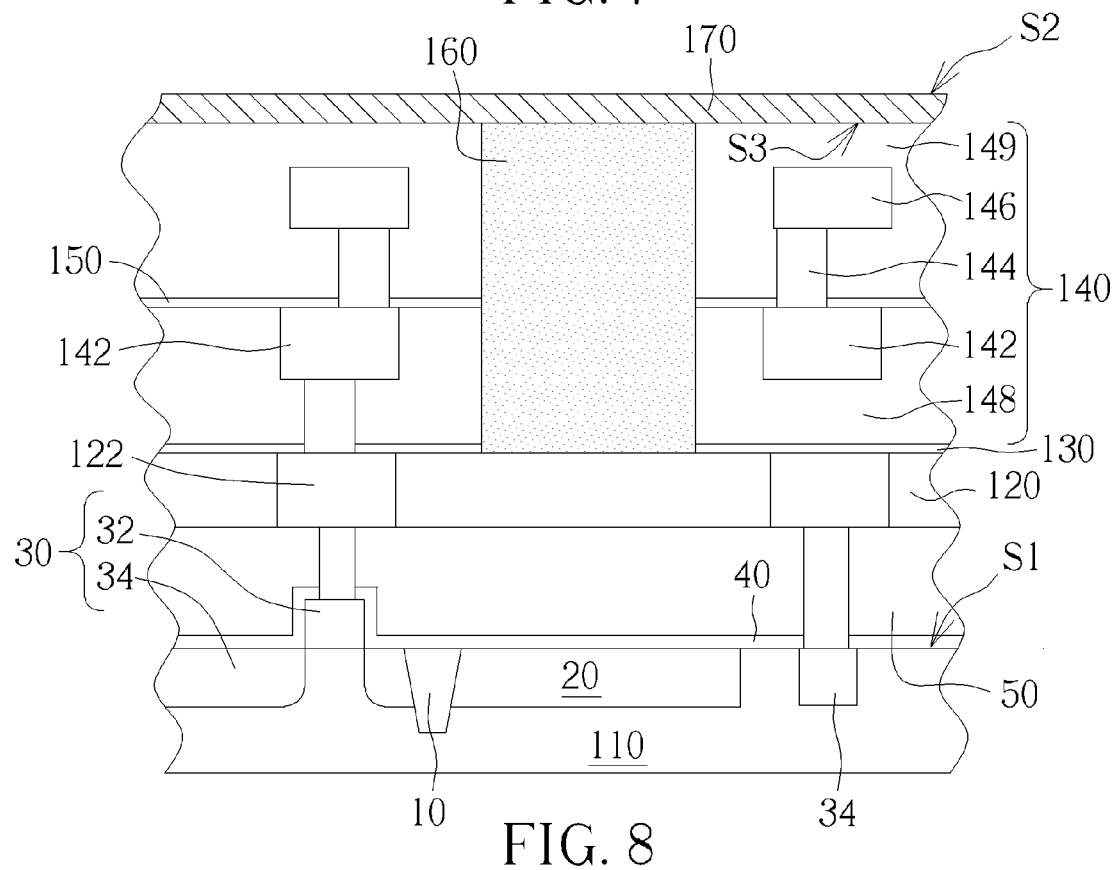

As shown in FIG. 8, a layer 170 may be formed above the color filter 160. The layer 170 is a passivation layer to serve as a flat top surface S2 for a microlens later formed thereon. The layer 170 maybe a transparent material or a photoresist, but it is not limited thereto. Furthermore, the reflectivity or the refractivity of the layer 170 may be chosen to optimize the light path passing through the layer 170 to the color filter 160 and the light sensing element 20, so as to increase the amount of light received by the light sensing element 20.

Figure 10:
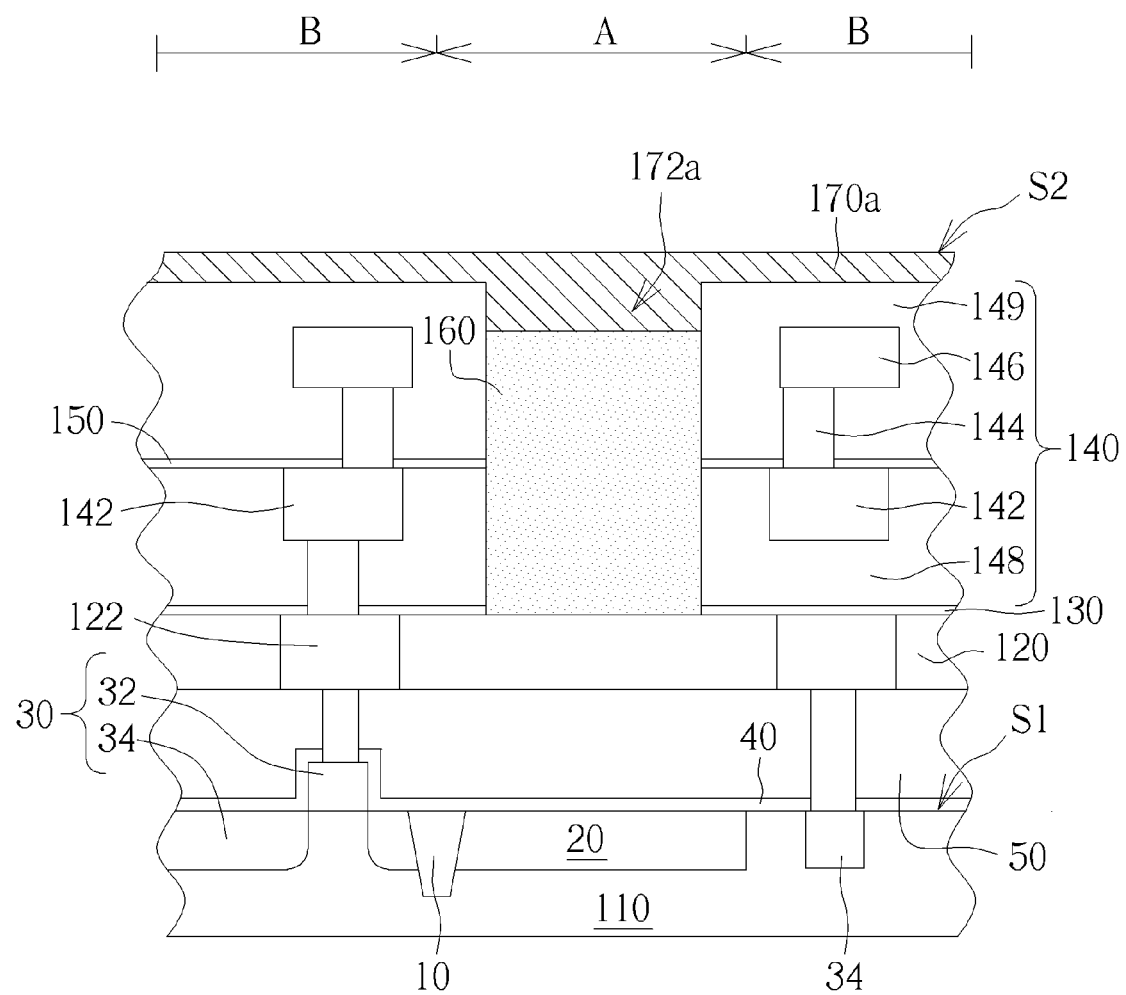
FIG. 10 schematically depicts a cross-sectional view of an image sensing process according to another embodiment of the present invention.

In this embodiment, the layer 170 has a flat bottom surface S3. Moreover, the layer 170 can further have an extension part 172a to form a layer 170a filling the recess R and contacting the color filter 160 as shown in FIG. 10. In this way, the position of the color filter 160 can be controlled by the depth, the size and the location of the recess R and the thickness of the color filter 160 can be adapted to a suitable thickness such as 1 μm ~2 μm by filling the extension part 172a in the recess R and covering the color filter 160.

Figure 9:
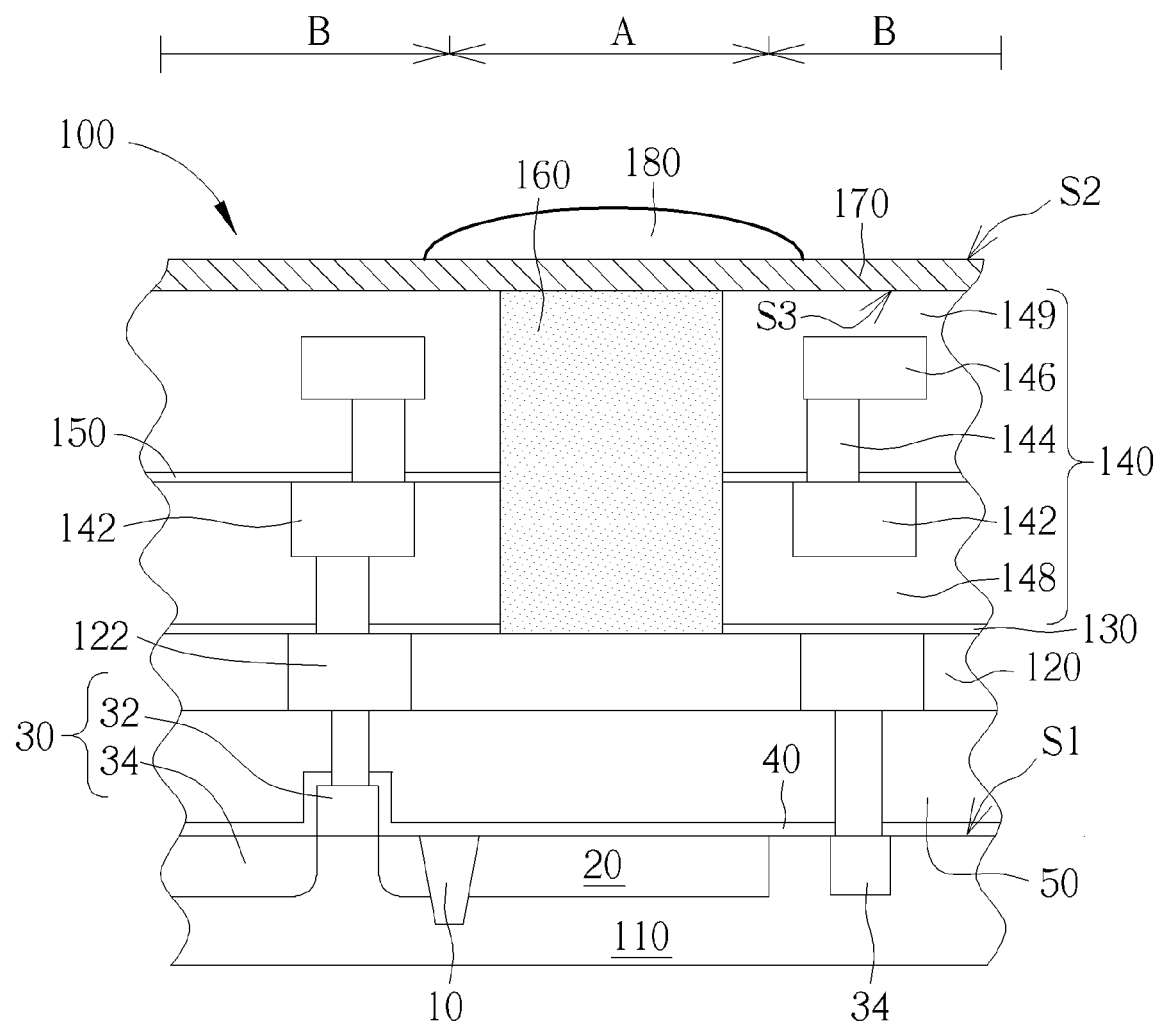

As shown in FIG. 9, a microlens 180 is formed above the color filter 160, enabling the light sensing element 20 to receive light incident to the microlens 180 and passing through the color filter 160. The microlens 180 preferably covers the whole color filter 160 to fully concentrate the incident light. Thus, an image sensor 100 is formed.

To summarize, the present invention provides an image sensor and process thereof that forms a recess in a second dielectric layer, thereby enabling a color filter in the recess and on the first dielectric layer to optimize a light path passing through the color filter to a light sensing element. Moreover, the depth, the size and the location of the recess can be adjusted to control the light path and the thickness of the color filter, thereby increasing the light sensitivity and improving the color division of a formed image sensor. Furthermore, a layer may be formed between a microlens and the color filter, and an extension part of the layer may fill the recess and cover the color filter, so that the thickness and the position of the color filter and the light path can be adjusted by the recess and the layer.

Moreover, the first and the second dielectric layer may be a single or a stacked of dielectric layer such as an inter metal dielectric (IMD), having at least an etch stop layer between them.

Thus, the recess in the second dielectric layer can be formed by methods such as etching using the etch stop layer to stop the etching, and then an etching process can be selectively performed to break through a part of the etch stop layer in a light path, but it is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a microlens for receiving light;
   a substrate comprising a light sensing element in a light sensing area for receiving the light incident to the microlens;
   a first dielectric layer and a second dielectric layer stacked on the substrate from bottom to top, wherein the first dielectric layer contains a bottom layer of metal interconnect structures directly on contact plugs and the second dielectric layer has a recess directly on the first dielectric layer and in an optical path between the microlens and the light sensing element;
   a color filter disposed in the recess, wherein the whole color filter is disposed on the bottom layer of the metal interconnect structures and the color filter trims with the bottom layer; and
   a patterned etch stop layer located between the first dielectric layer having a flat top surface and the second dielectric layer and covering the bottom layer of the metal interconnect structures, wherein sidewalls of the patterned etch stop layer contact the color filter.

2. The image sensor according to claim 1, wherein the substrate has a periphery area around the light sensing area.

3. The image sensor according to claim 2, wherein the metal interconnect structure corresponds to the periphery area.

4. The image sensor according to claim 3, wherein the patterned etch stop layer covers the metal interconnect structure but exposes a part of the first dielectric layer in the optical path between the microlens and the light sensing element.

5. The image sensor according to claim 4, wherein the recess exposes the part of the first dielectric layer, thereby disposing the color filter directly on the first dielectric layer.

6. The image sensor according to claim 4, wherein the patterned etch stop layer comprises a nitride layer, a silicon rich oxide layer, a silicon carbide layer or a carbon doped silicon nitride layer.

7. The image sensor according to claim 1, wherein the second dielectric layer comprises a stack of dielectric layers.

8. The image sensor according to claim 1, further comprising:
   a layer located between the microlens and the color filter.

9. The image sensor according to claim 8, wherein the layer has an extension part filling the recess and contacting the color filter.

10. The image sensor according to claim 8, wherein the layer comprises a transparent material or a photoresist.

11. The image sensor according to claim 1, wherein the thickness of the color filter is comprised in a range of 1 μm~2 μm.

12. An image sensing process, comprising:
    providing a substrate comprising a light sensing element in a light sensing area;
    sequentially forming a first dielectric layer containing a bottom layer of metal interconnect structures directly on contact plugs, an etch stop layer and a second dielectric layer stacked on the substrate;
    forming a recess in the second dielectric layer;
    patterning the etch stop layer between the first dielectric layer having a flat top surface and the second dielectric layer to form a patterned etch stop layer covering the bottom layer of the metal interconnect structures;
    forming a color filter in the recess directly on the first dielectric layer, wherein sidewalls of the patterned etch stop layer contact the color filter, wherein the whole color filter is disposed on the bottom layer of the metal interconnect structures and the color filter trims with the bottom layer; and
    forming a microlens above the color filter to enable the light sensing element to receive light incident to the microlens and passing through the color filter.

13. The image sensing process according to claim 12, wherein the substrate has a periphery area around the light sensing area.

14. The image sensing process according to claim 13, wherein the metal interconnect structure corresponds to the periphery area.

15. The image sensing process according to claim 14, wherein the patterned etch stop layer covers the metal interconnect structure but exposes a part of the first dielectric layer in an optical path between the microlens and the light sensing element.

16. The image sensing process according to claim 12, further comprising:
    forming an etch stop layer between the first dielectric layer and second dielectric layer to stop an etching process when forming the recess.

17. The image sensing process according to claim 16, further comprising:
    performing an etching process after the recess is formed to etch a part of the etch stop layer in an optical path between the microlens and the light sensing element.

18. The image sensing process according to claim 16, wherein the etch stop layer comprises a nitride layer, a silicon rich oxide layer, a silicon carbide layer or a carbon doped silicon nitride layer.

19. The image sensing process according to claim 12, further comprising:
    forming a layer above the color filter before the microlens is formed.

20. The image sensing process according to claim 19, wherein the layer has an extension part filling the recess and contacting the color filter.

* * * * *